(12) United States Patent
Lee et al.

(10) Patent No.: US 8,330,205 B2
(45) Date of Patent: Dec. 11, 2012

(54) NONVOLATILE SEMICONDUCTOR DEVICE INCLUDING A FLOATING GATE AND ASSOCIATED SYSTEMS

(75) Inventors: Se-Hoon Lee, Yongin-si (KR); Donghoon Jang, Seoul (KR); Jong Jin Lee, Seongnam-si (KR); Jeong-Dong Choe, Anyang-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 0 days.

(21) Appl. No.: 13/040,380

(22) Filed: Mar. 4, 2011

(65) Prior Publication Data

US 2011/0156125 A1    Jun. 30, 2011

Related U.S. Application Data

(62) Division of application No. 11/896,982, filed on Sep. 7, 2007, now Pat. No. 7,902,024.

(30) Foreign Application Priority Data

Apr. 30, 2007    (KR) .................................. 2007-42051

(51) Int. Cl.
*H01L 29/788* (2006.01)
(52) U.S. Cl. ..................... 257/316; 257/317; 257/E29.3
(58) Field of Classification Search .................. 257/316, 257/317, E29.3
See application file for complete search history.

(56) References Cited

U.S. PATENT DOCUMENTS

| | | | |
|---|---|---|---|
| 5,231,041 A | 7/1993 | Arima et al. | |
| 6,171,909 B1 | 1/2001 | Ding et al. | |
| 6,235,589 B1 | 5/2001 | Meguro | |
| 6,306,725 B1 * | 10/2001 | Nag et al. | 438/435 |
| 6,756,631 B2 | 6/2004 | Wu | |
| 6,844,231 B2 * | 1/2005 | Kim et al. | 438/257 |
| 6,878,985 B2 | 4/2005 | Arai et al. | |
| 6,933,194 B2 | 8/2005 | Narita et al. | |
| 6,949,792 B2 * | 9/2005 | Hurley et al. | 257/315 |
| 7,061,069 B2 * | 6/2006 | Mori et al. | 257/510 |
| 7,148,100 B2 | 12/2006 | Kim et al. | |
| 2008/0003744 A1 * | 1/2008 | Lee | 438/257 |

FOREIGN PATENT DOCUMENTS

| | | |
|---|---|---|
| JP | 10-012750 A | 1/1998 |
| KR | 10-2002-0091984 A | 12/2002 |
| KR | 10-2003-0056666 A | 7/2003 |

* cited by examiner

*Primary Examiner* — Robert Huber
(74) *Attorney, Agent, or Firm* — Lee & Morse, P.C.

(57) ABSTRACT

A memory device includes a first floating gate electrode on a substrate between adjacent isolation layers in the substrate, at least a portion of the first floating gate protruding above a portion of the adjacent isolation layers, a second floating gate electrode, electrically connected to the first floating gate electrode, on at least one of the adjacent isolation layers, a dielectric layer over the first and second floating gate electrodes, and a control gate over the dielectric layer and the first and second floating gate electrodes.

16 Claims, 16 Drawing Sheets

NONVOLATILE SEMICONDUCTOR DEVICE INCLUDING A FLOATING GATE AND ASSOCIATED SYSTEMS

CROSS REFERENCE TO RELATED APPLICATION(S)

This is a divisional application based on application Ser. No. 11/896,982 filed Sep. 7, 2007 now U.S. Pat. No. 7,902,024, the entire contents of which is hereby incorporated by reference.

BACKGROUND

1. Field of the Invention

Embodiments are related to a nonvolatile semiconductor device including a floating gate, a method of manufacturing the same and associated systems. More particularly, embodiments are related to a nonvolatile semiconductor device including a thin floating gate, a method of manufacturing the same and associated systems.

2. Description of Related Art

Important features for a nonvolatile memory include low cost, high integration density, low power consumption, long retention times, and high speed. One type of nonvolatile memory device is a flash memory, which may be inexpensive and consume little power, but also may be slow and have poor retention. Further, integration of current flash memories may be restricted due to a limit on how small a cell structure thereof may be realized. In particular, as floating gate of the cell structure is shrunk, floating gate interference may increase, decreasing the coupling ratio.

SUMMARY

Embodiments are therefore directed to a nonvolatile memory device, a method of manufacturing the same and associated systems, which substantially overcome one or more of the problems due to the limitations and disadvantages of the related art.

It is therefore a feature of an embodiment of the present invention to provide a memory device having an increased coupling ratio.

It is therefore another feature of an embodiment of the present invention to provide a memory device having an increased contact area with floating and gate electrodes.

At least one of the above and other features and advantages of the present invention may be realized by providing a memory device, including a first floating gate electrode on a substrate between adjacent isolation layers in the substrate, at least a portion of the first floating gate protruding above a portion of the adjacent isolation layers, a second floating gate electrode, electrically connected to the first floating gate electrode, on at least one of the adjacent isolation layers, a dielectric layer over the first and second floating gate electrodes, and a control gate over the dielectric layer and the first and second floating gate electrodes.

The memory device may be a memory array. Each memory cell in the memory array may include first and second floating gate electrode electrodes. The second floating gate electrode may only contact the first floating gate electrode at sidewalls thereof. The insulation layer may be adjacent the second floating gate electrode and on the adjacent isolation layers.

The insulation layer may protrude above the second floating gate electrode. An upper surface of the insulation layer and an upper surface of the second floating gate electrode are substantially even with one another. The isolation layer may include a protrusion adjacent the second floating gate electrode that protrudes above the second floating gate electrode. The protrusion may be non-planar.

A thickness of the second floating gate electrode may decrease in a direction away from the first floating gate. The first and second floating gate electrodes are made of different materials. The second floating gate electrode may include undoped polysilicon. The second floating gate electrode may protrude above the first floating gate electrode. An upper surface of the second floating gate electrode and an upper surface of the first floating gate electrode may be substantially even with one another. Heights of the first and second floating gate electrodes may be substantially co-extensive. The first floating gate may protrude above the second floating gate electrode. An entirety of the first floating gate electrode may be above the isolation layer.

At least one of the above and other features and advantages may be realized by providing a system, including a processor adapted to process data, and a memory device electrically coupled to the processor and adapted to provide data to the processor, the memory device including a first floating gate electrode on a substrate between adjacent isolation layers in the substrate, at least a portion of the first floating gate electrode protruding above the adjacent isolation layers, a second floating gate electrode, electrically connected to the first floating gate electrode, on at least one of the adjacent isolation layers, a dielectric layer over the first and second floating gate electrodes, and a control gate over the dielectric layer and the first and second floating gate electrodes.

At least one of the above and other features and advantages may be realized by providing a method for forming a memory device, including forming a first floating gate electrode on a substrate between adjacent isolation layers in the substrate, at least a portion of the first floating gate protruding above the adjacent isolation layers, forming a second floating gate electrode, electrically connected to the first floating gate electrode, on at least one of the adjacent isolation layers, forming a dielectric layer over the first and second floating gate electrodes, and forming a control gate over the dielectric layer and the first and second floating gate electrodes.

Forming the first floating gate may include forming a first floating gate layer on the substrate and patterning the first floating gate layer. Patterning the first floating gate layer may include forming a mask layer on the first floating gate layer, wherein patterning the first floating gate layer results in a stacked structure of the first floating gate and a mask. The method may further include forming trenches in the substrate adjacent the stacked structure and filling the trenches with an isolation material. The method may further include removing the isolation material to below an upper surface of the first floating gate. The method may further include forming a gate spacer on the stacked structure protruding above the isolation material.

The method may further include removing a portion of the gate spacer layer to form the second floating gate. Removing the portion of the gate spacer may include having an upper surface of the second floating gate being above an upper surface of the first floating gate. Removing the portion of the gate spacer may include having an upper surface of the second floating gate being below an upper surface of the first floating gate. Removing the portion of the gate spacer may include having an upper surface of the second floating gate being substantially level with an upper surface of the first floating gate.

The method may further include forming an insulation layer adjacent the gate spacer.

The method may further include removing a portion of the insulation layer. Removing the portion of the insulation layer may include having an upper surface of the insulation layer above an upper surface of the second floating gate. Removing the portion of the insulation layer may include having an upper surface of the insulation layer below an upper surface of the first floating gate. Removing the portion of the insulation layer may include having an upper surface of the insulation layer substantially even with an upper surface of the second floating gate. Removing the isolation material includes removing the isolation material to below a lower surface of the first floating gate.

Filling the trenches with the isolation material may include partially filling the trenches with a first isolation material and fully filling the trenches with a second isolation material. The method may further include removing the first isolation material to below an upper surface of the first floating gate using a removal process having a higher removal rate for the first isolation material than the second isolation material.

DETAILED DESCRIPTION OF THE FIGURES

The above and other features and advantages of the present invention will become more apparent to those of ordinary skill in the art by describing in detail exemplary embodiments thereof with reference to the attached drawings, in which.

DETAILED DESCRIPTION OF EMBODIMENTS

Korean Patent Application No. 10-2007-42051, filed on Apr. 30, 2007, in the Korean Intellectual Property Office, and entitled: "Thin Floating Gate Non-volatile Memory Device and Method for Manufacturing the Same," is incorporated by reference herein in its entirety.

Embodiments will now be described more fully hereinafter with reference to the accompanying drawings. They may, however, be embodied in different forms and should not be construed as limited to the embodiments set forth herein. Rather, these embodiments are provided so that this disclosure will be thorough and complete, and will fully convey the scope of the invention to those skilled in the art.

A floating gate memory structure may be equivalent to two capacitors connected in series between a control gate electrode and a substrate. A first capacitor may have a capacitance $C_{ipd}$, e.g., between the control gate electrode and a floating gate electrode. A second capacitor may have a capacitance $C_{tun}$, e.g., between the floating gate electrode and the substrate. Capacitance is proportional to a dielectric constant of a thin film between opposing electrodes and an area of the opposing electrodes, and inversely proportional to a distance between the opposing electrodes.

A potential $V_{fg}$ of a floating gate electrode when a write potential $V_{wg}$ is applied to the control gate electrode may be determined in accordance with a coupling ratio $C_r$ between the two capacitors. The coupling ratio $C_r$ may be defined as follows:

$$Cr=Cipd/(Cipd+Ctun)$$

Thus, to increase the coupling ratio $C_r$, the capacitance $C_{ipd}$ only needs to be as large as possible relative to the capacitance $C_{tun}$. The increased coupling ratio $C_r$ may allow a write potential applied to the control gate electrode to be reduced.

Embodiments may provide a memory device having an enhanced coupling ratio CR, wherein the capacitance $C_{ipd}$ may be increased by increasing a contact area of the layer between the floating and gate control electrodes with the floating and control gate electrodes.

Figure 1A:
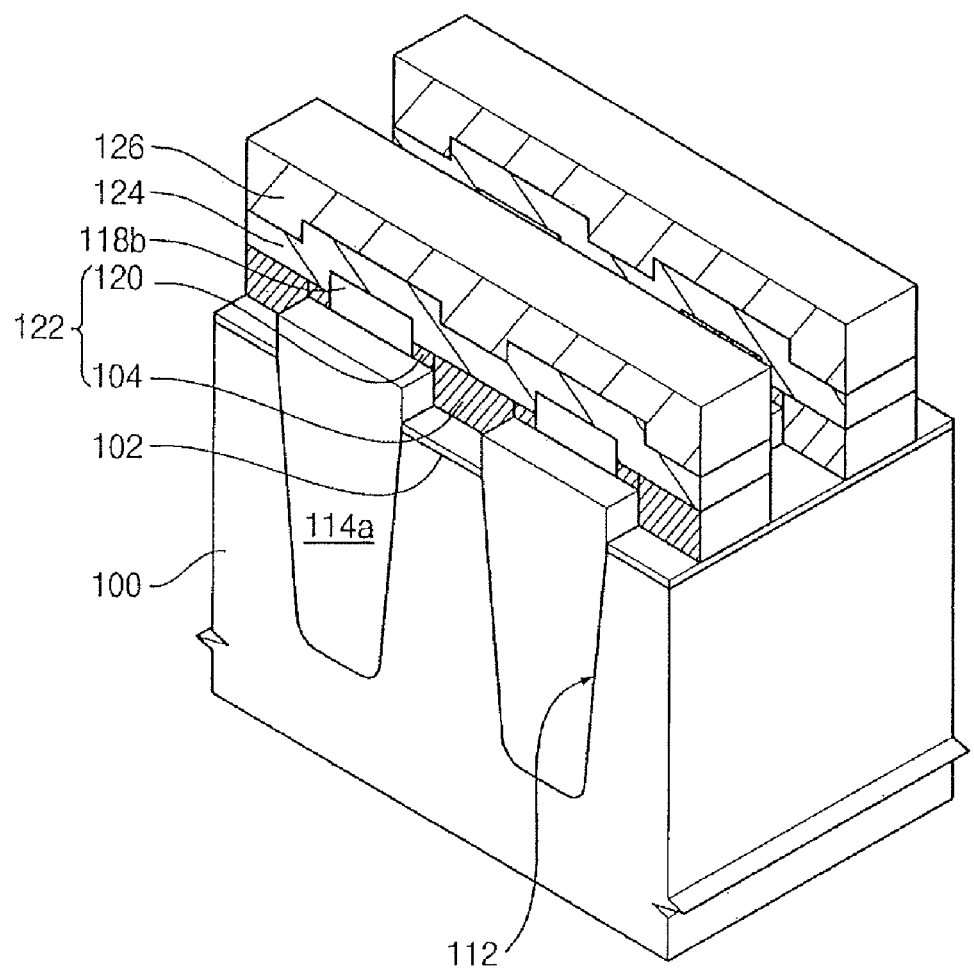
FIG. 1A illustrates a perspective view of a memory device according to a first embodiment.
Figure 1B:
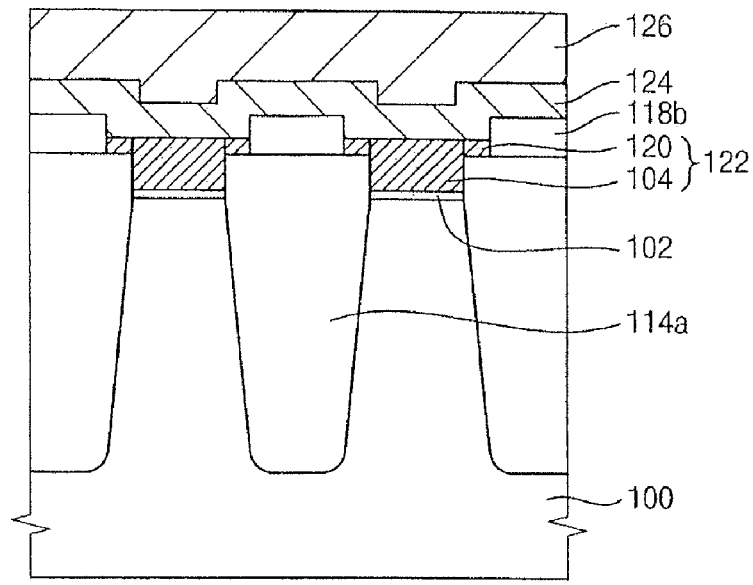
FIG. 1B illustrates a cross-sectional view of the memory device of FIG. 1A.

FIGS. 1A and 1B respectively illustrate perspective and cross-sectional views of a memory device according to an embodiment.

The memory device may include a substrate 100 having trenches 112 therein. The trenches 112 may be filled with an isolation layer 114a. A tunnel oxide layer 102 may be on an upper surface of the substrate 100. A floating gate electrode 122 may include a first floating gate electrode 104 and a second floating gate electrode 120. A first insulation layer 118b may be between adjacent floating gate electrodes and on the isolation layer 114a. A high dielectric layer 124, e.g., an inter poly dielectric (IPD) layer, may be on the floating gate electrode 122 and the first insulation layer 118b. A control gate electrode 126 may be on the IPD layer 124 and over the floating gate electrode 122.

This floating gate structure may provide a high coupling ratio $C_r$, since a capacitance $C_{ipd}$ associated with the IPD layer 124 may be significantly larger than a capacitance $C_{tun}$ associated with the tunnel oxide layer 102. In particular, as may be seen in FIGS. 1A and 1B, the IPD layer 124 may employ a high dielectric constant layer and have an increased contact area with the floating gate electrode 122. Further, the first insulation layer 118b protruding above the floating gate electrode 122 may convolute the IPD layer, and may thus increase a contact area of the IPD layer 124 with the control gate electrode 126.

FIGS. 2A to 2L illustrate cross-sectional views of stages in a method of manufacturing the memory device of FIG. 1A according to an embodiment.

Figure 2A:
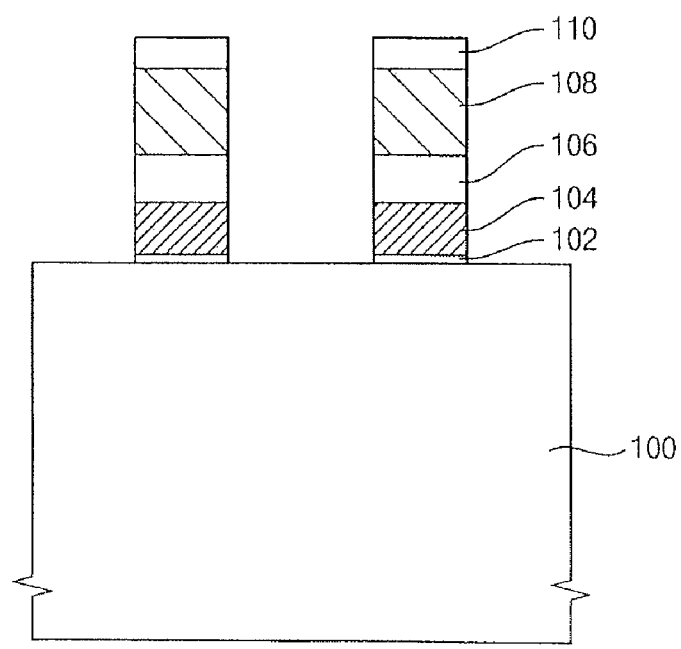
FIGS. 2A through 2L illustrate cross-sectional views of stages in a method of manufacturing the memory device of the FIG. 1A according to an embodiment.

As illustrated in FIG. 2A, a tunnel oxide layer 102, a first floating gate layer 104, a first oxide layer 106, a first nitride layer 108 and a second oxide layer 110 may be sequentially formed on the substrate 100. The first oxide layer 106, the first nitride layer 108 and the second oxide layer 110 may form a hard mask layer. The hard mask layer may be patterned using a resist as a mask (not shown). The hard mask pattern may then be used to form the first floating gate layer 104, the tunnel oxide layer 102 and a trench 112.

The substrate 100 may be silicon. The tunnel oxide layer 102 may be thin, e.g., less than about 100 Å. The first floating gate layer 104 may include polysilicon. The nitride layer 108 may be silicon nitride.

Figure 2B:
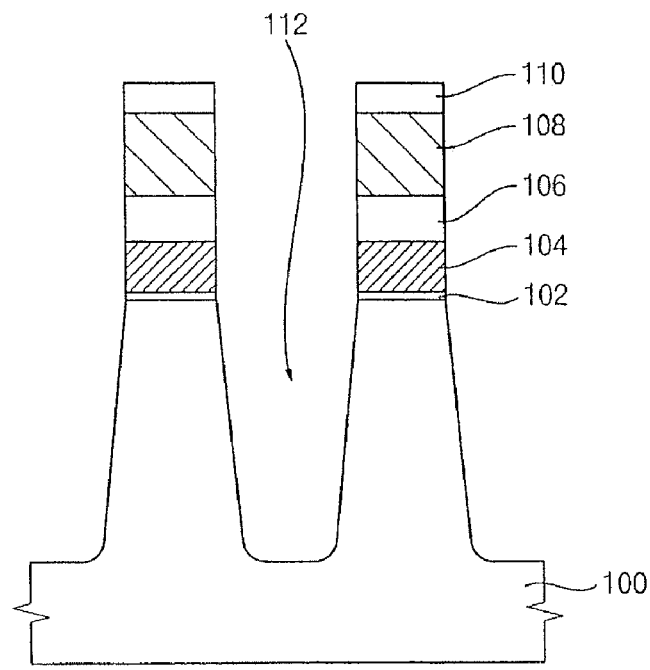
Figure 2C:
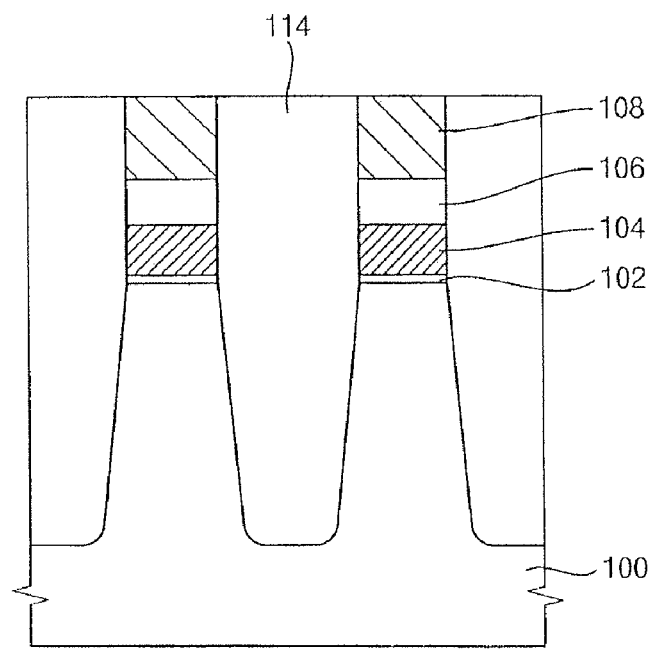

As shown in FIG. 2B, the trench 112 may be formed in the substrate 100, e.g., using a shallow trench isolation process. As shown in FIG. 2C, the trench 112 may be filled with an isolation material 114, e.g., using a chemical vapor deposition (CVD), and may be planarized, e.g., using a chemical mechanical polishing (CMP). The planarization may also remove the second oxide layer 110, with the first nitride layer 108 serving as a stop layer.

Figure 2D:
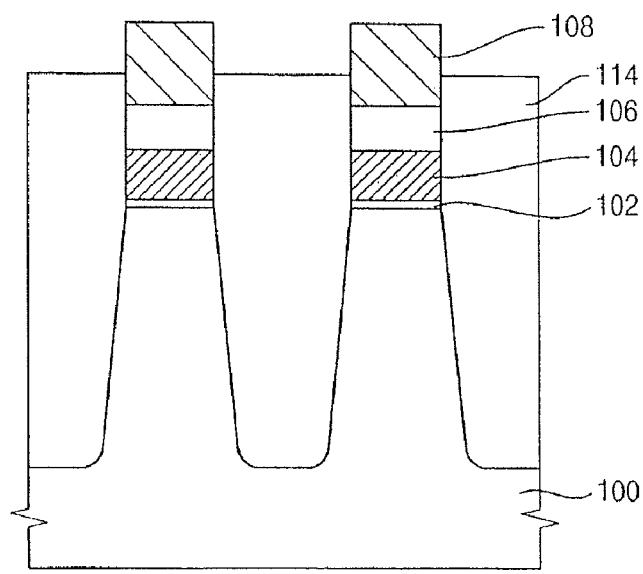

As shown in FIG. 2D, an upper portion of the remaining isolation material 114 may be further removed, e.g., by wet etching. The removal stop point may be higher than an upper surface of the first oxide layer 106. If the removal stop point is lower than the first oxide layer 108, the first oxide layer 108 may be simultaneously removed, e.g., if the etch is not sufficiently selective.

Figure 2E:
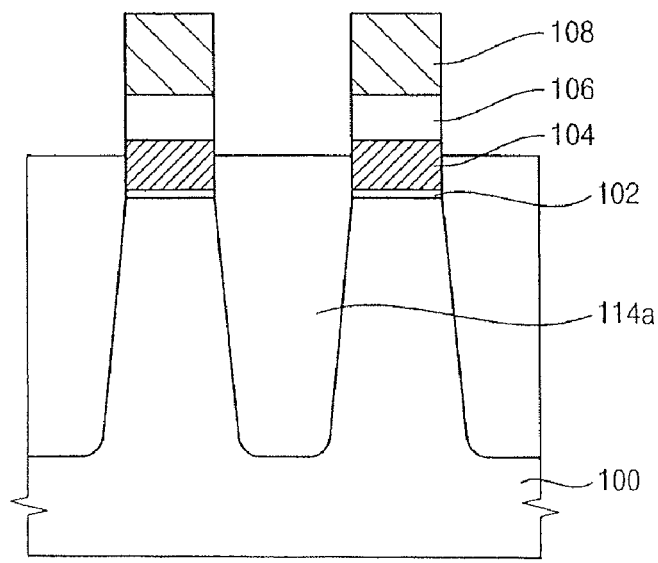

As shown in FIG. 2E, a further upper portion of the remaining isolation layer 114 may be removed using a process, e.g., a dry etch process, that does not affect the first nitride pattern 108, the first oxide pattern 108 or the first floating gate electrode 104. The removal stop point may be higher than the tunnel oxide layer 102 and lower than an upper surface of the first floating gate electrode 104, e.g., may be higher than half of a height of the first floating gate electrode 104.

Figure 2F:
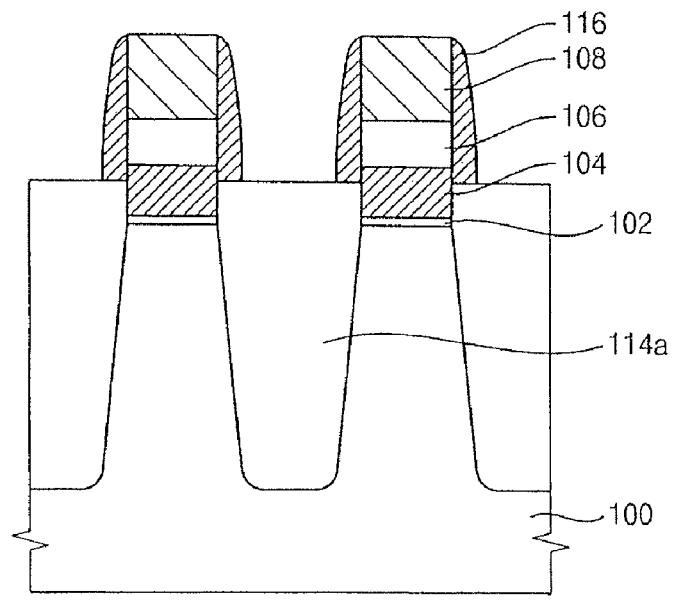

As shown in FIG. 2F, a gate spacer 116 may be formed, e.g., by CVD and an etch back process. A thickness of the gate spacer 116 may thus be readily controlled. The gate spacer 116 may be processed further to form the second floating gate 120, as described below. A thicker gate spacer 116 may increase the coupling ratio Cr.

Figure 2G:
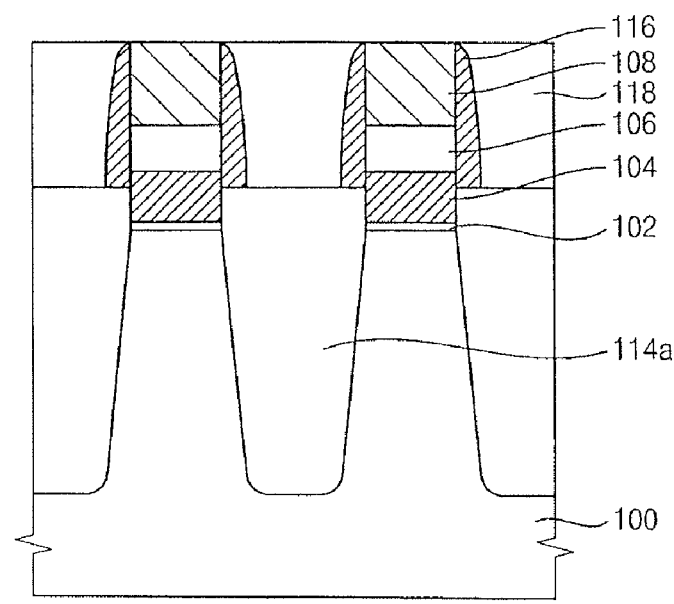
Figure 2H:
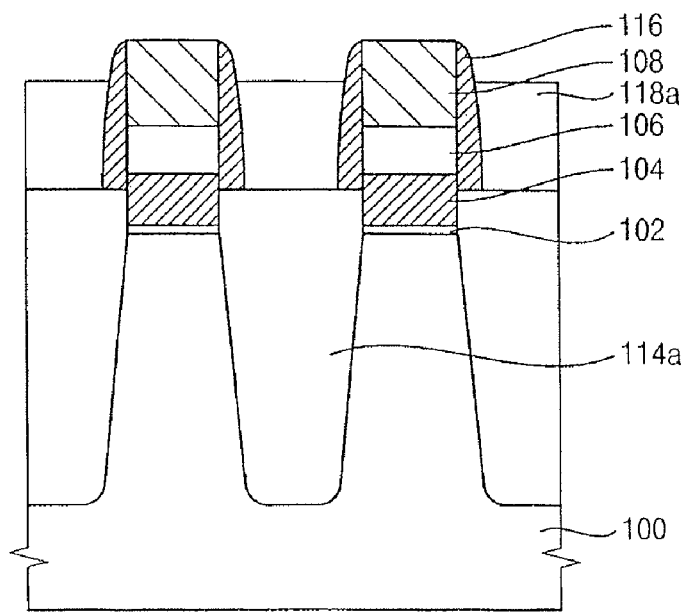
Figure 2I:
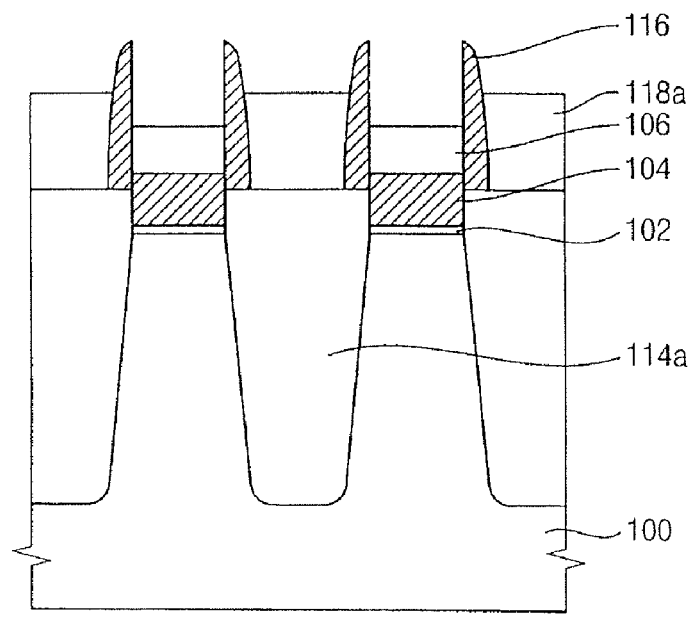

As shown in FIG. 2G, a first insulation material 118 may be provided, e.g., by CVD and CMP. An upper portion of the first insulation material 118 may be removed, e.g., by wet etching, as shown in FIG. 2H, leaving a first isolation layer 118a. The removal stop point may be higher than the first oxide layer 106. The first nitride layer 108 may be removed, e.g., by wet etching using a different etchant than for the removal of the upper portion of the first insulation material 118, as shown in FIG. 2I.

Figure 2J:
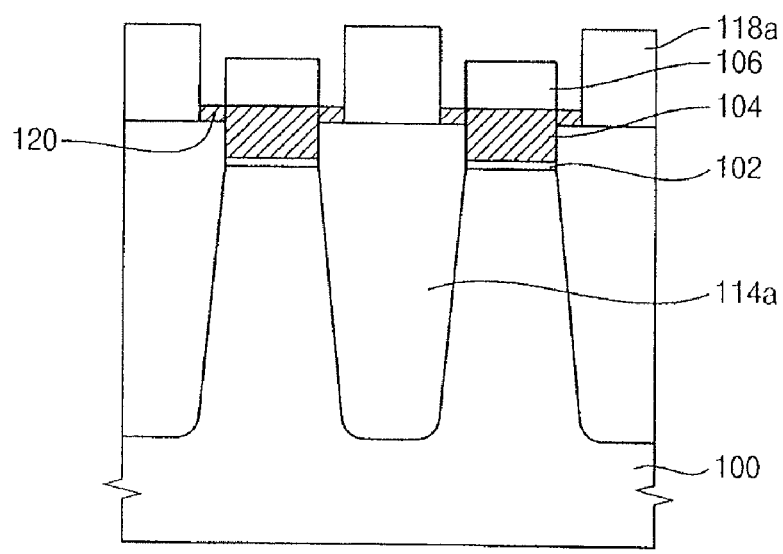

Then, the gate spacer 116 may be partially removed, e.g., by wet or dry etching, to form the second floating gate electrode 120, as shown in FIG. 2J. The second floating gate electrode 120 may include polysilicon, tungsten (W), titanium nitride (TiN) or thallium (Tl). The removal stop point may be controlled, e.g., by time. By controlling the removal stop point, the second floating gate electrode 120 may have a height lower, higher or the same as that of the first floating gate electrode 104.

Figure 2K:
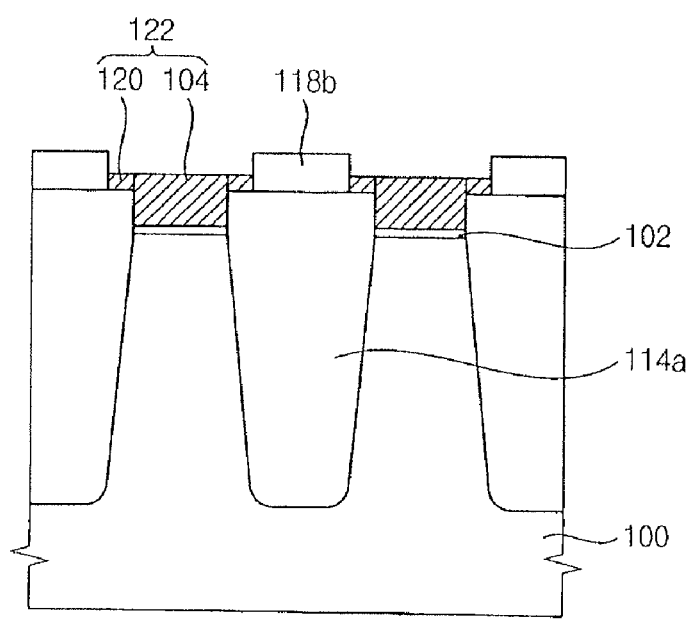

The first oxide layer 106 may then be removed, e.g., by wet etching. The first insulation layer 118a may be also partially removed to form the first insulation layer 118b, as shown in FIG. 2K. Thus, the insulation layer 118b may have a higher, lower or even height with the T-shaped floating gate electrode 122.

Figure 2L:
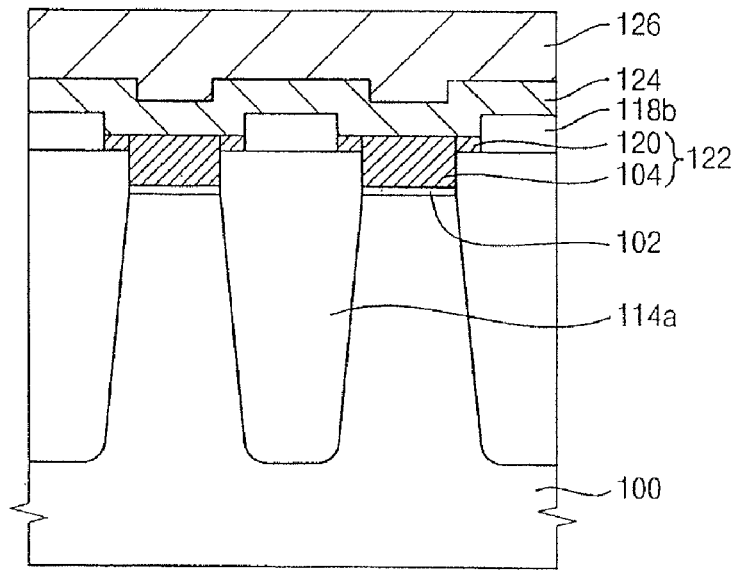

As shown in FIG. 2L, the IPD layer 124 and the control gate 126 may be sequentially formed on the floating gate 122 and the first insulation layer 118b, e.g., by a CVD process. The IPD layer 124 may include, e.g., $Al_2O_3$ or $Hf_2O_3$. The control gate 126 may be, e.g., polysilicon or metal, e.g., W or Ti.

Figure 3:
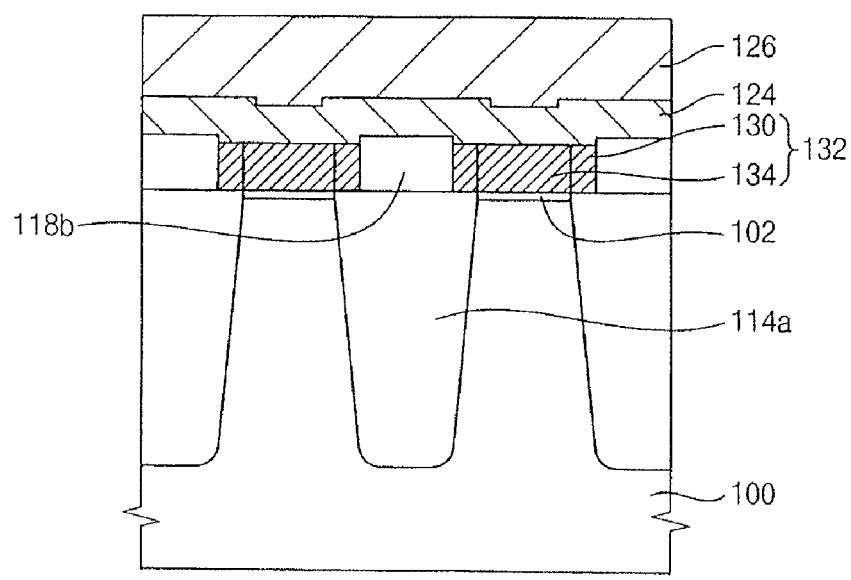
FIG. 3 illustrates a cross-sectional view of a memory device according to an embodiment.

Another embodiment is illustrated in FIG. 3, in which a floating gate electrode 132 includes a first floating gate electrode 134 and a second floating gate electrode 130 having a same height. An upper surface of the tunnel oxide layer 102 may be even with an upper surface of the isolation layer 114a. Again, a capacitance associated with the IPD layer 124 may be greater than a capacitance associated with the tunnel oxide layer 102.

Figure 4:
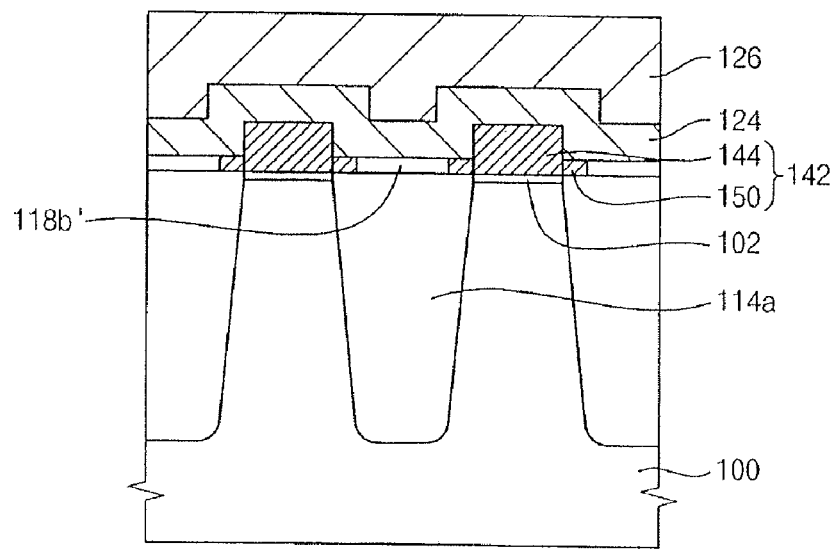
FIG. 4 illustrates a cross-sectional view of a memory device according to an embodiment.

Another embodiment is illustrated in FIG. 4, in which a floating gate electrode 142 may include a first floating gate 144 which is higher than a second floating gate 150. A first insulation layer 118b' may have a same height as the second floating gate 150, e.g., may be lower than the first floating gate 144. An electrode area in contact with the IPD layer 124 may be greater than that of the tunnel oxide layer 102.

Figure 5:
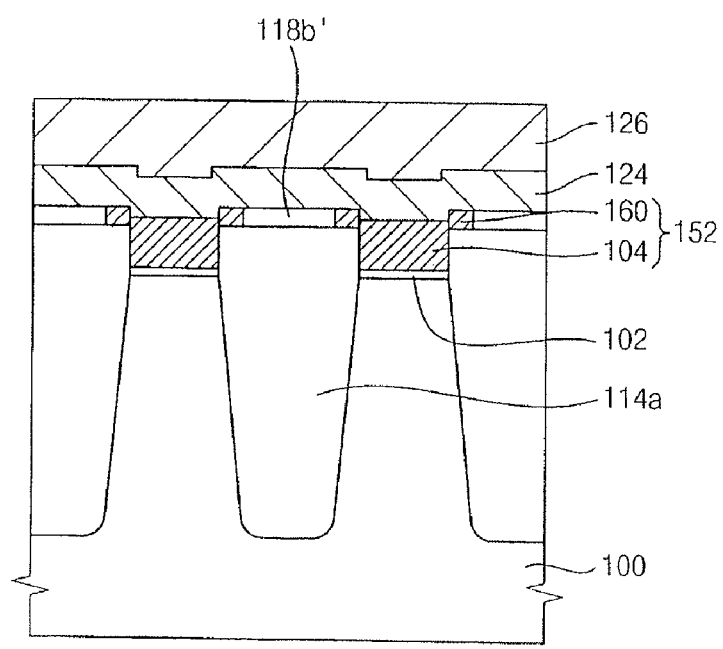
FIG. 5 illustrates a cross-sectional view of a memory device according to an embodiment.

Another embodiment is illustrated in FIG. 5, in which a floating gate electrode 152 includes a second floating gate electrode 160 that is higher than the first floating gate electrode 104. The first insulation layer 118b' may have a same height as the second floating gate electrode 160, and may be higher than the first floating gate electrode 104. An electrode area in contact with the IPD layer 124 may be greater than that of the tunnel oxide layer 102.

Figure 6:
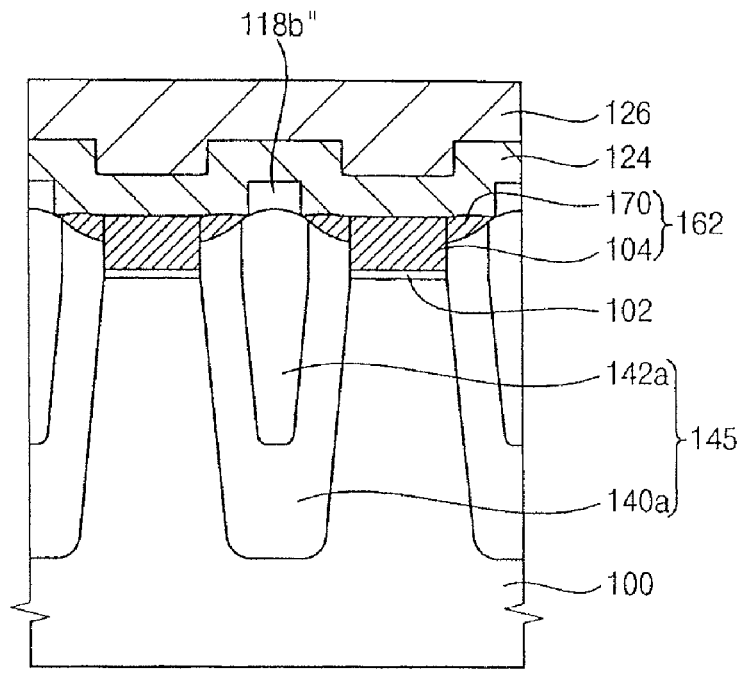
FIG. 6 illustrates a cross-sectional view of a memory device according to an embodiment.

Another embodiment is illustrated in FIG. 6, in which the trench 112 may be filled with multiple isolation layers and an upper surface of the multiple isolation layers 140a, 142a, forming an isolation layer 145, may be not be planar. In turn, a floating gate electrode 162 may include the first floating gate 104 and a second floating gate 170 that may follow the resulting contours of the upper surface of the multiple isolation layers 140a, 142a. Further, a first insulation layer 118b" may be only on a highest part of the isolation layer 145, i.e., on the second isolation layer 142a.

Figure 7A:
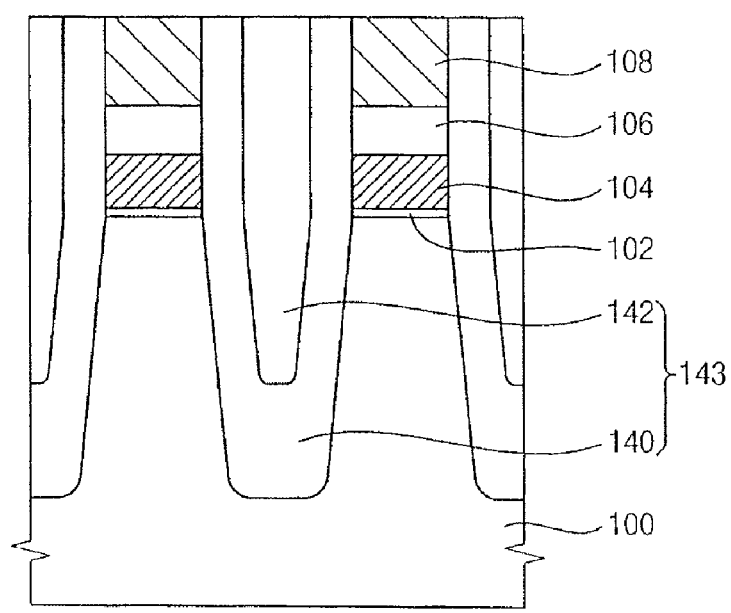
FIGS. 7A through 7C illustrate cross-sectional views of stages in a method of manufacturing the memory device of FIG. 6 according to an embodiment.

A method of forming the memory device according to this embodiment may include the stages shown in FIGS. 2A and 2B. Then, after the trench 112 is formed, the method may proceed as illustrated in FIG. 7A, in which the trench 112 may be filled with a first isolation layer 140 and a second isolation layer 142, e.g., by CVD and CMP processes, to form an isolation layer 143. The first nitride layer 108 may serve as an etch stop layer during the CMP process in which a top portion of the isolation layer 143 and the second oxide layer 110 are removed.

Figure 7B:
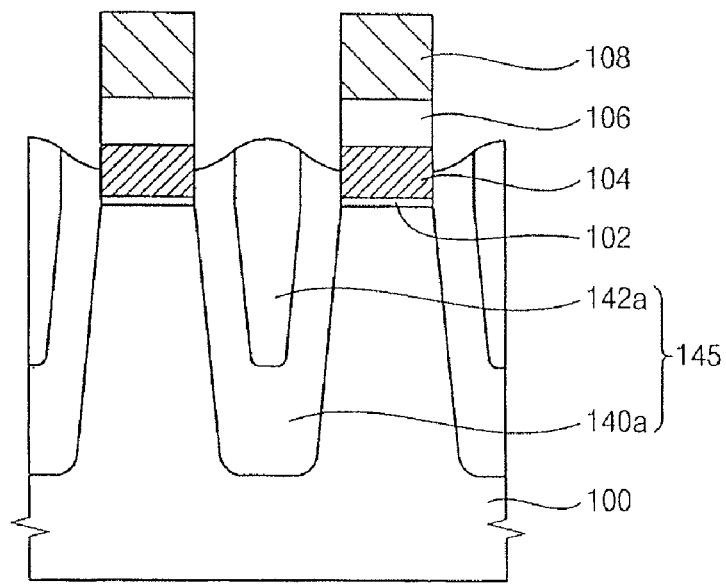

Then, a remaining upper portion of the isolation layer 143 may be further be differentially removed by a process, e.g., a dry etch process, having a faster removal rate for the material of the first isolation layer 140 than the material of the second isolation layer 142. The etch stop point may be higher than the tunnel oxide layer and lower than an upper portion of the first floating gate 122. Thus, the isolation layer 145 having a non-planar upper portion may be formed, as illustrated in FIG. 7B.

Figure 7C:
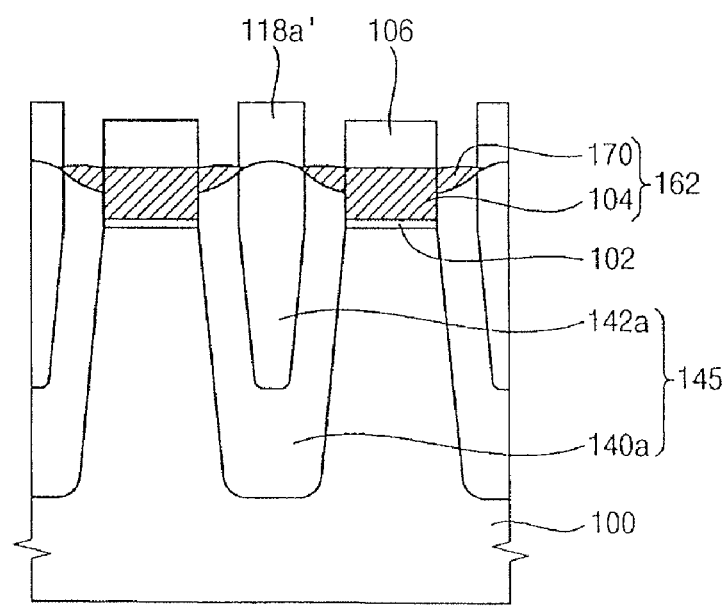

Then, when the second floating gate electrode 170 is formed on the isolation layer 145 having a non-planar upper surface, a shape of the second floating gate electrode 170 will follow the contours of the non-planar upper surface of the isolation layer 145, as illustrated in FIG. 7C. Thus, the second floating gate electrode 170 in accordance with this embodiment may have a smaller surface area facing adjacent memory devices, which may reduce interference, while maintaining an increased electrode contact area for the IPD layer 124 compared with the tunnel oxide layer 102.

Although the above embodiments have assumed the gate stack is formed before the trench, the trench may be formed and filled with isolation material before forming the gate stack. Thus, the isolation material in the trench may be integral with the insulation material.

Practical Applications

The memory device according to embodiments described above may be employed in various configurations, e.g., in a NAND flash memory device or a NOR flash memory device.

Figure 8:
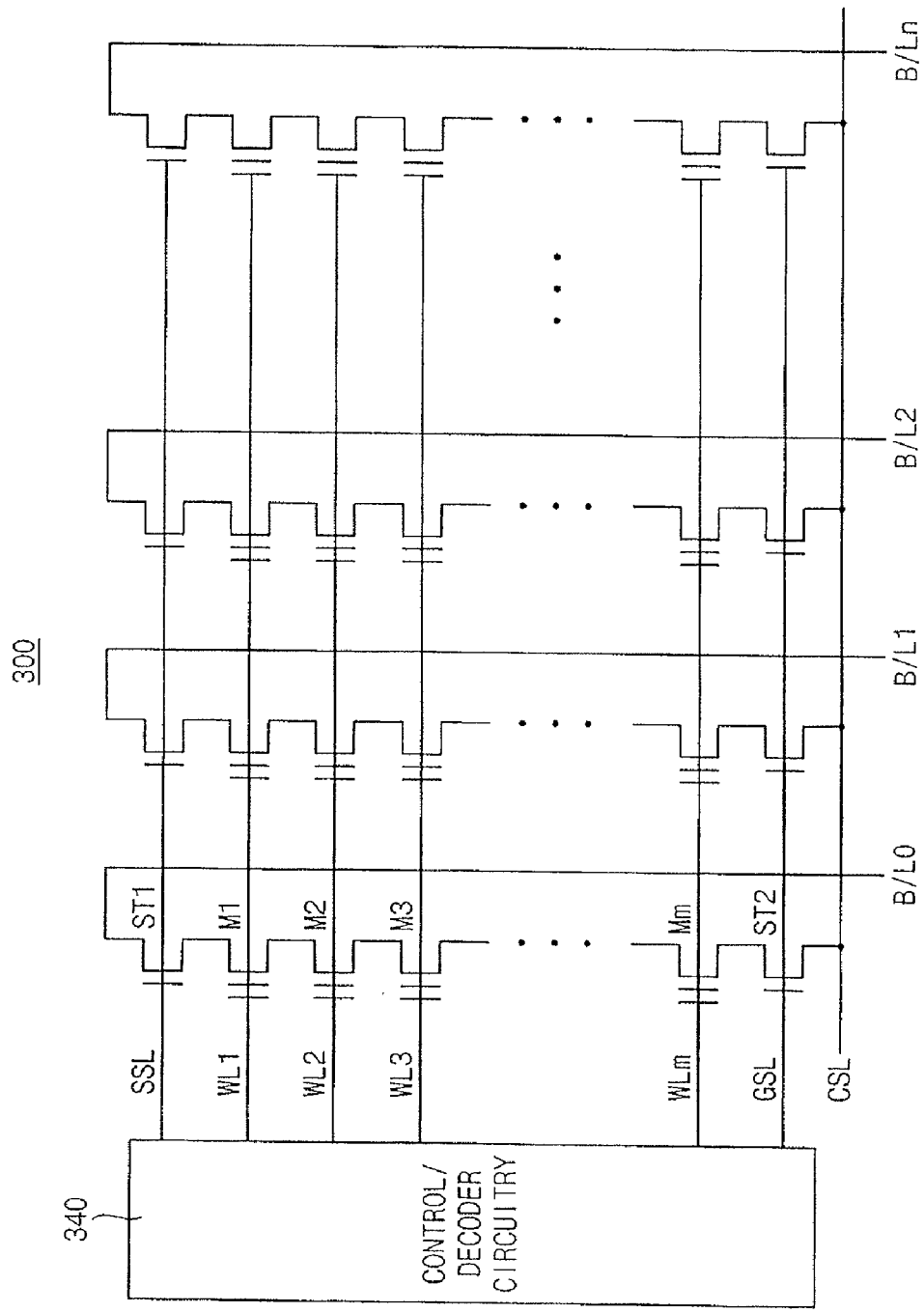
FIG. 8 illustrates a schematic diagram of a NAND flash memory in accordance with an embodiment.

A schematic diagram of a NAND flash memory is illustrated in FIG. 8. As shown therein, the NAND flash memory may include a memory cell array including a plurality of cell strings (or NAND strings) corresponding to respective bit lines BL0 to BLn. Each of the cell strings may include a string selection transistor ST1 as a first selection transistor, a ground selection transistor ST2 as a second selection transistor and a plurality of memory cells M1 to Mm, which may be configured according to any of the above embodiments, serially connected between the selection transistors ST1 and ST2. The string selection transistor ST1 may have a drain connected to a corresponding bit line and a gate connected to a string selection line SSL. The ground selection transistor ST2 may have a source connected to a source column selection line CSL and a gate connected to a ground selection line GSL. The memory cells M1 to Mm may be serially connected to a source of the string selection transistor ST1 and a drain of the ground selection transistor ST2. The memory cells M1 to Mm may be connected to respective word lines WL1 to WLm. The word lines WL1 to WLm, the string selection line SSL, and the ground selection line GSL may be connected to a control/decoder circuit 340.

Figure 9:
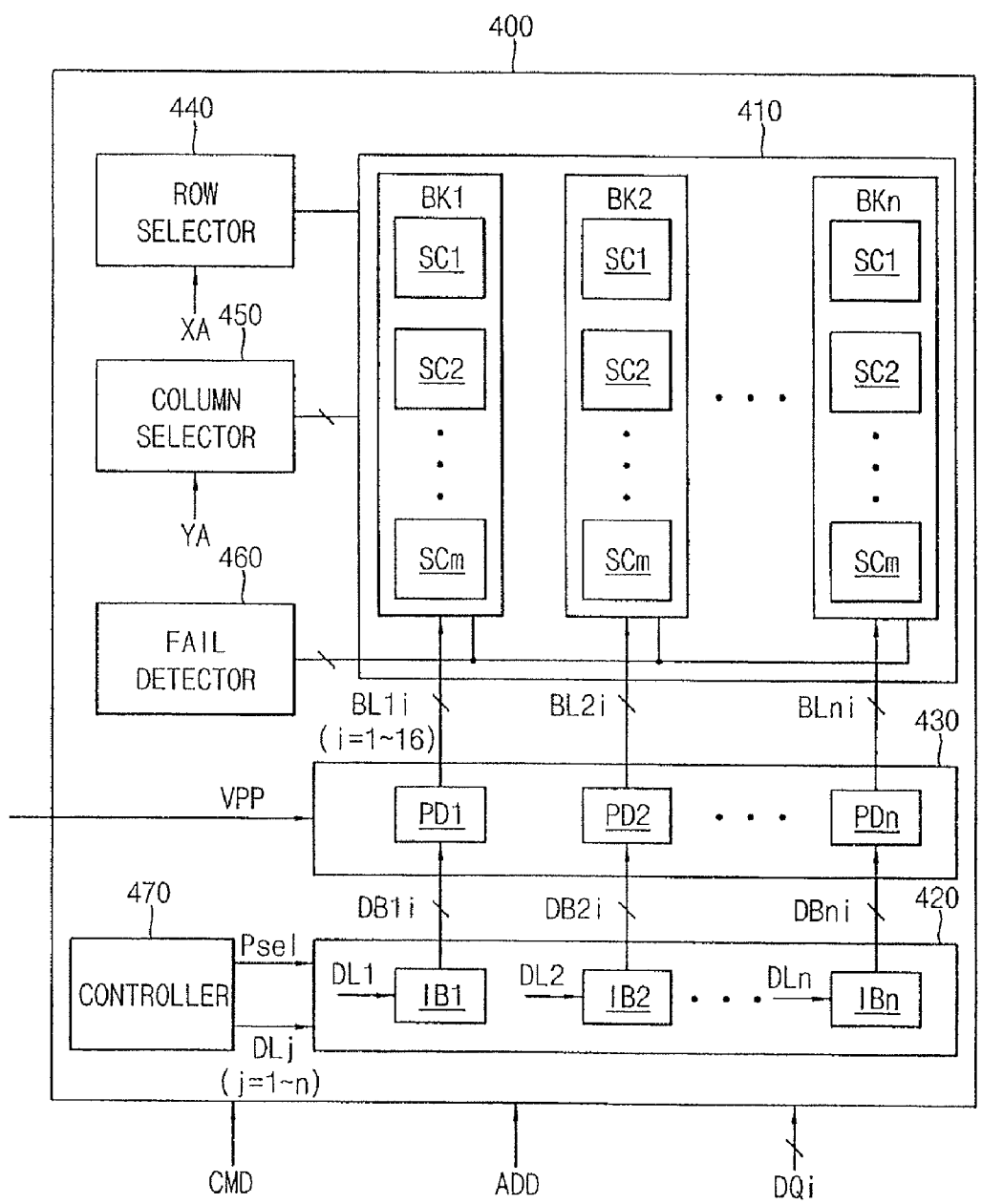
FIG. 9 illustrates a block diagram of a NOR flash memory according to an embodiment.

A block diagram of an embodiment of a NOR flash memory device 400 in accordance is illustrated in FIG. 9. Referring to FIG. 9, the NOR flash memory device 400 may include a cell array 410, an input buffer 420, a program driver 430, a row selector 440, a column selector 450, a fail detector 460, and a controller 470. The NOR flash memory 400 may receive command signals CMD, address signals ADD, data DQi, and a high voltage VPP from a host (not shown).

The cell array 410 may include a plurality of banks BK1 to BKn. Each bank may include a plurality of sectors SC1 to SCm each as a unit of erasing. Each sector may include a plurality of memory cells (not shown, but which may be configured according to any of the above embodiments) coupled to a plurality of word lines and bit lines. Output lines and output circuitry are omitted from FIG. 9 so that the overall NOR flash memory 400 may be clearly illustrated. FIG. 9, in conjunction with FIG. 10, which shows one of the plurality of banks and its sectors in greater detail than in FIG. 9, will enable one skilled in the art to fully understand the output circuitry needed for the operation of the NOR flash memory device 400.

The row selector 440 may select one word line in response to a row address XA. The column selector 450 may selects n bit lines, e.g., sixteen bit lines, for every bank in response to a column address YA. The structures and operations regarding the cell array 410, the row selector 440, and the column selector 450 will be described with reference to FIG. 10 in detail.

The data input buffer 420 may receive program data of n bits in parallel, equal to the number of banks. The program data may be stored in unit buffers IB1 to IBn of the input buffer 420 in units of n bits. The unit buffers IB1 to IBn may be alternatively operable under the control of data latch signals DLj (j=1-n). For example, if DL1 is high, the first unit buffer IB1 may receive n data bits in parallel. The data received may be held in the first unit buffer IB1 for a period of time. The data input buffer 420 may dump data held in the unit buffers IB1 to IBn contemporaneously to the program driver 430 when a program selection signal PSEL is high.

The controller 740 may apply the program selection signal PSEL and the data latch signal DLj to the data input buffer 420. The data input buffer 420 may receive the program data in units of n bits, i.e., the number of the banks, or less, alternatively or sequentially, under regulation of the controller 470.

The program driver 430 may apply a program voltage simultaneously to selected bit lines among bit line packets BL1i to BLni (i=1-n) in response to program data packets DB1i to DBni (i=1-16) stored in the data input buffer 420. The program driver 430 may include unit drivers PD1 to PDn corresponding to the unit buffers IB1 to IBn. The program driver 430 may be supplied with the high voltage VPP from an external power source that is greater than the (internal) power source voltage.

The fail detector 460 may sense data stored in the cell array 410 and detect a failure of programming by comparing the sensed data with the program data stored in the data input buffer 420. The fail detector 460 may be shared by all the banks of the cell array 410.

Figure 10:
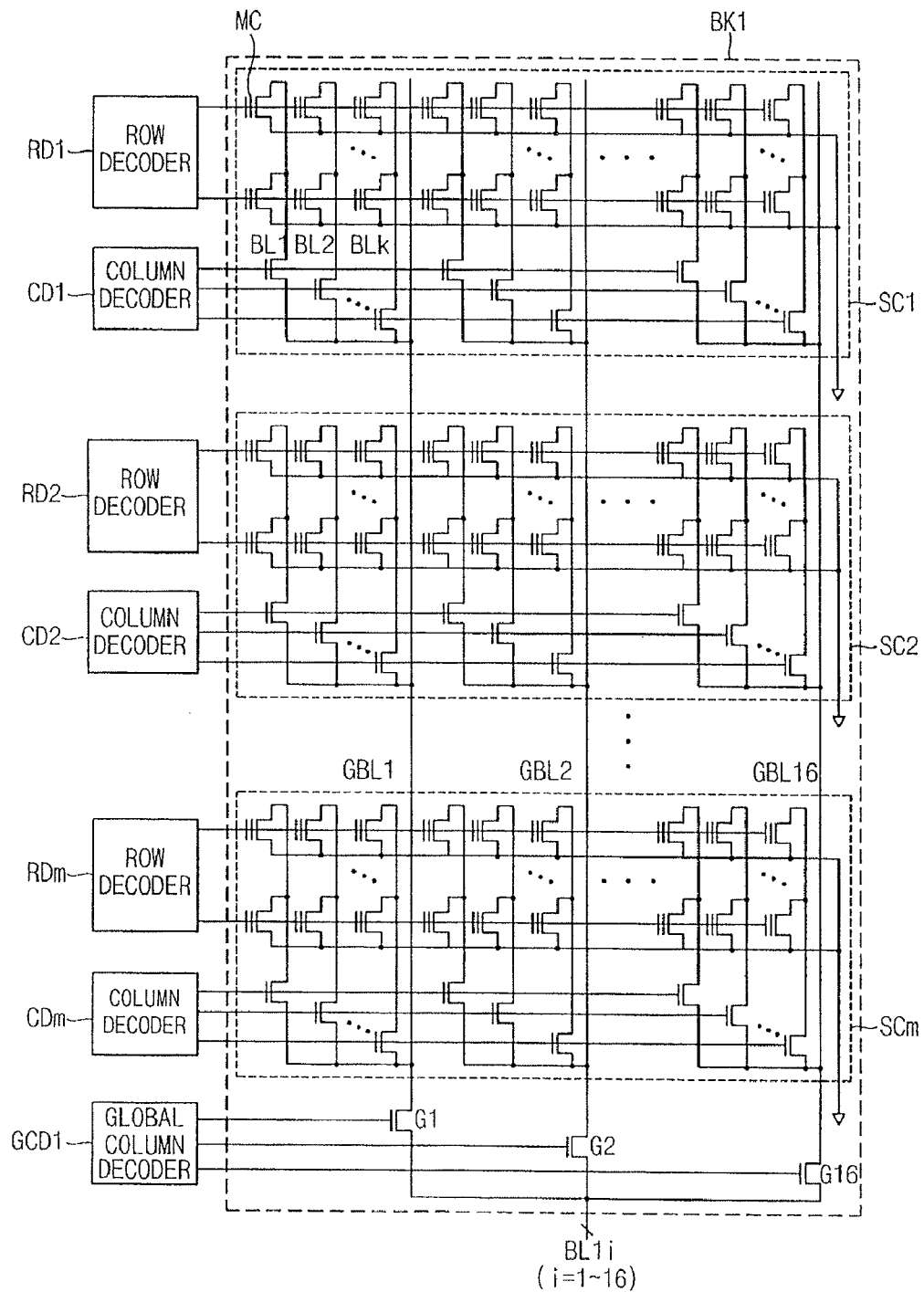
FIG. 10 illustrates a schematic diagram of a bank of a cell array associated with a row and column selector of a NOR flash memory according to an embodiment.

FIG. 10 illustrates a circuit pattern of the first bank BK1 as an example associated with the row and column selectors and the peripherals, shown in FIG. 9. The row selector 440 may include a plurality of row decoders RD1 to RDm, and the column selector 450 may include a plurality of column decoders CD1 to CDm. Pairs of the row and column decoders correspond to each of the sectors SC1 to SCm. The column selector 50 may further include a global column decoder GCD1 arranged corresponding to the first bank BK1.

Referring to FIG. 10, the first sector SC 1 may be coupled to the row decoder RD1 for driving a word line assigned to a selected memory cell and the column decoder for selecting the bit lines BL1 to BLk that are assigned to a global bit line (e.g., GBL1). The global bit lines may include n bit lines, here sixteen, so that each of the global bit lines GBL1 to GBL16 may be linked with the bit lines BL1 to BLk (preferably namable as local bitlines relative to the global bitlines) through their corresponding column gate transistors in every sector. The column gate transistors may be controlled by the column decoder corresponding thereto. Other sectors may include the same corresponding connections as the first sector SC1.

The global bit lines GBL1 to GBL16 may lead from one (e.g., BL1i) of the bit line packets BL1i to BLni provided by the program driver 430, via selection transistors G1 to G16 controlled by the global column decoder GCD1. As a result, the memory cell array 410 may have a hierarchical architecture with the local bit lines each connected to the memory cells along columns and the global bit lines each connected to a group of the local bit lines.

In the following FIGS. 11 to 16, different uses of a memory 510 will be illustrated. It is to be understood that any of the embodiments discussed above may be used for the memory 510.

Figure 11:
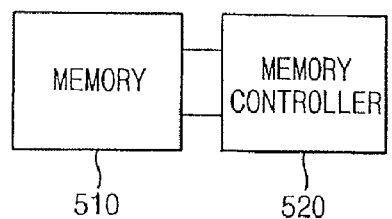
FIG. 11 illustrates a block diagram of a memory in communication with a memory controller according to an embodiment.
Figure 12:
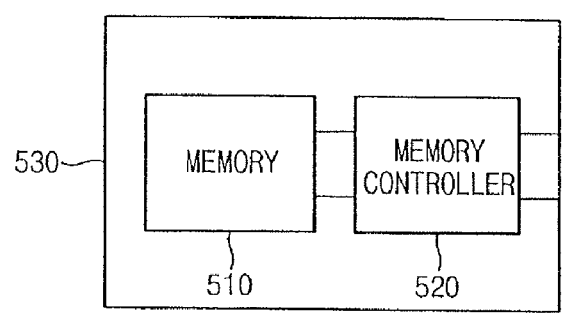
FIG. 12 illustrates a block diagram of a memory card including a memory and a memory controller according to an embodiment.

FIG. 11 illustrates a block diagram of a memory 510 in communication with a memory controller 520 configured to manage the flow of data to and from the memory 510. FIG. 12 illustrates a memory card 530 on which the memory 510 and the memory controller 520 may be integrated.

Figure 13:
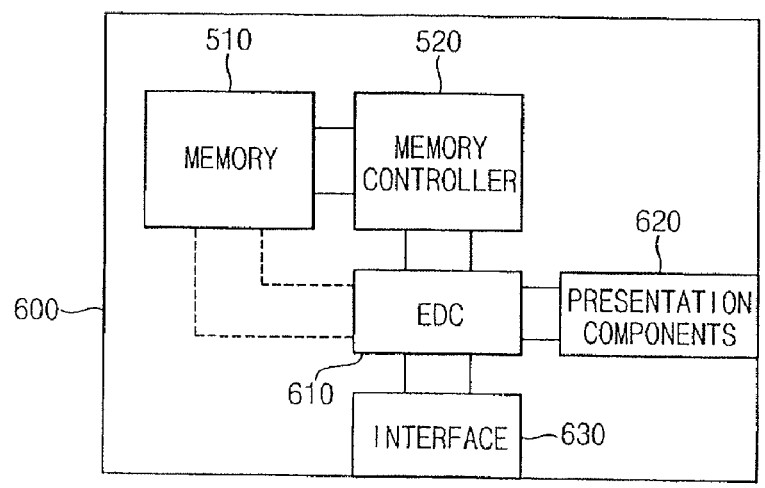
FIG. 13 illustrates a block diagram of another memory card including a memory and a memory controller according to an embodiment.

FIG. 13 illustrates a block diagram of a memory card 600 on which the memory 510, the memory controller 520, an electronic data collector (EDC) 610, an interface 630 and presentation components 620 are integrated. The presentation components 620 may prescribe the specific manner in which data output from the EDC 610 are formatted for display on the interface 630.

Figure 14:
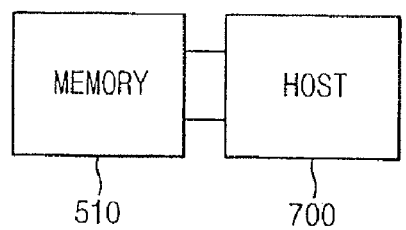
FIG. 14 illustrates a block diagram of a memory in communication with a host according to an embodiment.
Figure 15:
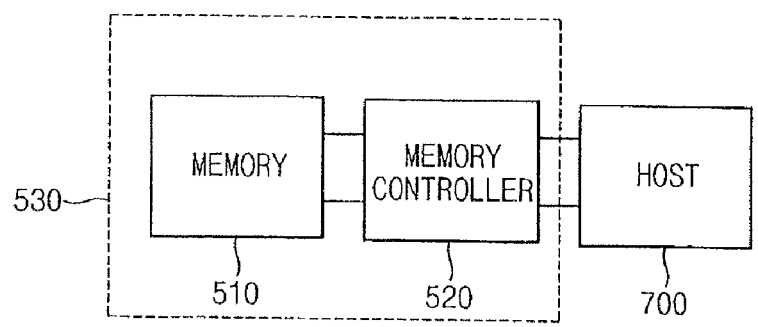
FIG. 15 illustrates a block diagram of a memory card in communication with a host according to an embodiment.
Figure 16:
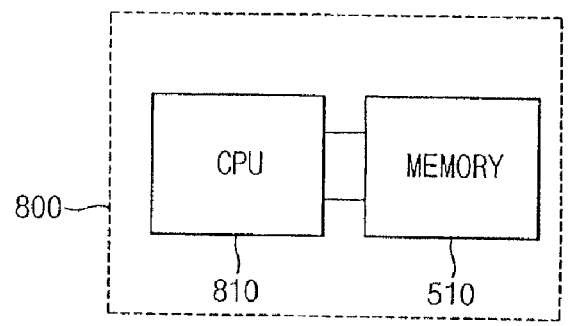
FIG. 16 illustrates a block diagram of a memory card including a central processing unit and a memory according to an embodiment.

FIG. 14 illustrates a block diagram in which the memory 510 directly communicates with a host. FIG. 15 illustrates a block diagram in which the memory controller 520 on the memory card 530 is between the memory 510 and the host 700. FIG. 16 illustrates a memory card 800 on which a central processing unit 810 and the memory 510 are integrated.

As described herein, when a layer or element is referred to as being "on" another layer or substrate, it can be directly on the other layer or substrate, or intervening layers may also be present. When a layer is referred to as being "under" another layer, it can be directly under, and one or more intervening layers may also be present. When a layer is referred to as being "between" two layers, it can be the only layer between the two layers, or one or more intervening layers may also be present. When an element or layer is referred to as being "connected" or "coupled" to another element or layer, it can be directly connected or coupled to the other element or layer, or intervening elements or layers may be present. In contrast, when an element is referred to as being "directly connected" or "directly coupled" to another element or layer, no intervening elements or layers are present.

As used herein, the term "and/or" includes any and all combinations of one or more of the associated listed items. Further, although terms such as "first," "second," "third," etc., may be used herein to describe various elements, components, regions, layers and/or sections, these elements, components, regions, layers and/or sections should not be limited by these terms. These terms are only used to distinguish one element, component, region, layer and/or section from another. Thus, a first element, component, region, layer and/or section could be termed a second element, component, region, layer and/or section without departing from the teachings of the embodiments described herein.

Spatially relative terms, such as "beneath," "below," "lower," "above," "upper," etc., may be used herein for ease of description to describe the relationship of one element or feature to another element(s) or feature(s), as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

As used herein, the singular forms "a," "an" and "the" are intended to include the plural forms as well, unless the context clearly indicates otherwise. It will be further understood that the terms "comprises," "comprising," "includes," and "including" specify the presence of stated features, integers, steps, operations, elements, components, etc., but do not preclude the presence or addition thereto of one or more other features, integers, steps, operations, elements, components, groups, etc.

Example embodiments are described herein with reference to cross-sectional illustrations that are schematic illustrations of idealized example embodiments and/or intermediate structures. As such, variations from the shapes of the illustrations, as a result, for example, of manufacturing techniques and/or tolerances, may be expected. Thus, the example embodiments described herein should not be construed as limited to the particular shapes of regions illustrated herein, and are to include deviations in shapes that result, for example, from manufacturing. For example, an implanted region illustrated as a rectangle may have rounded or curved features, and/or a gradient of implant concentration at its edges, rather than a binary change from an implanted to a non-implanted region. Likewise, a buried region formed by implantation may result in some implantation in the region between the buried region and the surface through which the implantation takes place. Thus, the regions illustrated in the figures are schematic in nature and their shapes may not illustrate the actual shape of the region, are not intended to limit the scope of the present invention to the exact shape illustrated.

Unless otherwise defined, all terms used herein, including technical and scientific terms, have the same meaning as commonly understood by one of ordinary skill in the art. It will be further understood that terms such as those defined in commonly used dictionaries should be interpreted as having a meaning that is consistent with their meaning in the context of the relevant art, and not in an idealized or overly formal sense unless expressly so defined herein.

Example embodiments have been disclosed herein, and although specific terms are employed, they are used and are to be interpreted in a generic and descriptive sense only and not for purpose of limitation. Accordingly, it will be understood by those of ordinary skill in the art that various changes in form and details may be made without departing from the spirit and scope of the present invention as set forth in the following claims.

What is claimed is:

1. A memory device, comprising:
    a first floating gate electrode on a substrate between adjacent isolation layers in the substrate, at least a portion of the first floating gate protruding above a portion of the adjacent isolation layers;
    a second floating gate electrode electrically connected to the first floating gate electrode, the second floating gate electrode being on a non-planar portion of an upper surface of at least one of the adjacent isolation layers, and a lower surface of the second floating gate electrode having a first non-planar contour corresponding to a second non-planar contour of the non-planar portion of the upper surface of the one of adjacent isolation layers;
    a dielectric layer over the first and second floating gate electrodes;
    a control gate over the dielectric layer and the first and second floating gate electrodes; and
    an insulation layer adjacent the second floating gate electrode and on an uppermost surface of the adjacent isolation layers, the insulation layer protruding above the second floating gate electrode.

2. The memory device as claimed in claim 1, wherein the memory device is a memory array, each memory cell in the memory array including first and second floating gate electrodes.

3. The memory device as claimed in claim 1, wherein the second floating gate electrode only contacts the first floating gate at sidewalls thereof.

4. The memory device as claimed in claim 1, wherein the isolation layer includes a protrusion adjacent the second floating gate electrode that protrudes above the second floating gate electrode.

5. The memory device as claimed in claim 1, wherein a thickness of the second floating gate electrode decreases in a direction away from the first floating gate and toward the insulation layer.

6. The memory device as claimed in claim 1, wherein the first and second floating gate electrodes are made of different materials.

7. A system, comprising;
a processor adapted to process data; and
a memory device electrically coupled to the processor and adapted to provide data to the processor, the memory device including
 a first floating gate electrode on a substrate between adjacent isolation layers in the substrate, at least a portion of the first floating gate electrode protruding above the adjacent isolation layers,
 a second floating gate electrode electrically connected to the first floating gate electrode, the second floating gate electrode being on a non-planar portion of an upper surface of at least one of the adjacent isolation layers, and a lower surface of the second floating gate electrode having a first non-planar contour corresponding to a second non-planar contour of the non-planar portion of the upper surface of the one of adjacent isolation layers,
 a dielectric layer over the first and second floating gate electrodes,
 a control gate over the dielectric layer and the first and second floating gate electrodes, and
 an insulation layer adjacent the second floating gate electrode and on an uppermost surface of the adjacent isolation layers, the insulation layer protruding above the second floating gate electrode.

8. The memory device as claimed in claim 1, wherein the uppermost surface of the adjacent isolation layers has a contoured shape and the non-planar portion is a part of the uppermost surface.

9. The memory device as claimed in claim 8, wherein the insulation layer is on another non-planar portion of the uppermost surface of the adjacent isolation layers.

10. A memory device, comprising:
a first floating gate electrode on a substrate between adjacent isolation layers in the substrate, at least a portion of the first floating gate protruding above a portion of the adjacent isolation layers;
a second floating gate electrode electrically connected to the first floating gate electrode, the second floating gate electrode being on a non-planar portion of an upper surface of at least one of the adjacent isolation layers, the second floating gate electrode being directly on the non-planar portion of the upper surface of the one of the adjacent isolation layers;
a dielectric layer over the first and second floating gate electrodes;
a control gate over the dielectric layer and the first and second floating gate electrodes; and
an insulation layer adjacent the second floating gate electrode and on an uppermost surface of the adjacent isolation layers, the insulation layer protruding above the second floating gate electrode.

11. The memory device as claimed in claim 1, wherein a first thickness of a first region of the second floating gate electrode is smaller than a second thickness of a second region of the second floating gate electrode, the first region being adjacent to the insulation layer and the second region being adjacent to the first floating gate electrode.

12. The memory device as claimed in claim 11, wherein the second region is between the first floating gate electrode and the first region.

13. The memory device as claimed in claim 11, wherein the first and second thicknesses extend in a direction between the substrate and the dielectric layer.

14. The memory device as claimed in claim 1, wherein the non-planar portion of the upper surface of the one of the adjacent isolation layers is defined by a first isolation layer and a second isolation layer adjacent to the first isolation layer, the first isolation layer having a higher etching selectivity than the second isolation layer.

15. The memory device as claimed in claim 1, wherein the insulation layer protrudes above both the second floating gate electrode and the first floating gate electrode, the insulation layer being on a highest most portion of the upper surface of the one of the adjacent isolation layers.

16. The memory device as claimed in claim 1, wherein a lower surface of the insulation layer and a lower surface of the second floating gate electrode are adjacent to one another.

* * * * *